(12) United States Patent
Na

(10) Patent No.: US 6,556,476 B1
(45) Date of Patent: Apr. 29, 2003

(54) NON-VOLATILE MEMORY DATA PROTECTION

(75) Inventor: Hanjoo Na, Fremont, CA (US)

(73) Assignee: Unigen Corporation, Fremont, CA (US)

(*) Notice: Subject to any disclaimer, the term of this patent is extended or adjusted under 35 U.S.C. 154(b) by 0 days.

(21) Appl. No.: 10/094,756

(22) Filed: Mar. 11, 2002

(51) Int. Cl.[7] .............................................. G11C 16/00
(52) U.S. Cl. ................................. 365/185.04; 365/195
(58) Field of Search ............................ 365/185.04, 195, 365/189.07, 185.09, 185.11, 185.12

(56) References Cited

U.S. PATENT DOCUMENTS 5,363,334 A * 11/1994 Alexander et al. ........... 365/195
5,513,136 A * 4/1996 Fandrich et al. ........ 365/185.04
5,592,641 A * 1/1997 Fandrich et al. ........ 365/185.04

* cited by examiner

*Primary Examiner*—Tan T. Nguyen
(74) *Attorney, Agent, or Firm*—Robert Charles Hill

(57) ABSTRACT

A write-protected memory device has two write modes. Such memory device has many memory cells organized into pages. A normal write mode checks a one-bit flag collocated with every memory cell to see if writes are allowed. If the flag indicates a write operation to that memory cell is allowed, the flag is toggled and the cell is written. If the flag has previously been toggled, the write operation is prevented. A special write mode allows write operations to memory cells regardless of the state of the one-bit flag. The special write mode can be discerned in hardware by the loading of a register with a reprogrammable password, or the splitting of a normal single write-enable pin into two independent pins, e.g., normal write and special write. The memory operations can proceed either in page mode or cell-by-cell

7 Claims, 3 Drawing Sheets

NON-VOLATILE MEMORY DATA PROTECTION

BACKGROUND OF THE INVENTION

1. Field of the Invention

The present invention relates to computer data memory, and more particularly to devices and methods for protecting data in non-volatile memories.

2. Description of Related Art

It often occurs that computer files and databases that are accessible to certain persons should not be modifiable by those persons. For example, read only. Microsoft WORD has a save-file mode that allows the usual WORD file to be saved as read only.

There are two conventional methods for making data read-only. The first enforces the read-only mode with software programming, and the other uses circuit hardware to enforce read-only operation. Some designs use hardware write-protection to prevent noise or misaddressing from overwriting data inadvertently. Unfortunately, neither prior art method is trouble-free.

The software read-only protection generally depends on the manufacturer to define the protected-data areas. The user cannot change these borders. Thus when the data protection is enabled, it is impossible to reprogram that memory or file.

The hardware read-only protection generally requires a device pin to be pulled high or low. This is not real protection, because anyone can reprogram the data if they can get to the pin and pull it right way. Such protection also operates only in blanket mode, either all the data in the chip is write-protected or it is not. Individual cells in the device are not manipulated for read/write protection.

SUMMARY OF THE INVENTION

An object of the present invention is to provide a system for protecting data in memories.

Another object of the present invention is to provide a device that reprogrammably protects user data on a cell-by-cell basis.

Briefly, memory protection embodiment of the present invention comprises a memory device with two write modes. The memory device has many memory cells organized into pages. A normal write mode checks a one-bit flag collocated with every memory cell to see if writes are allowed. If the flag indicates a write operation to that memory cell is allowed, the flag is toggled and the cell is written. If the flag has previously been toggled, the write operation is prevented. A special write mode allows write operations to memory cells regardless of the state of the one-bit flag. The special write mode can be discerned in hardware by the loading of a register with a reprogrammable password, or the splitting of a normal single write-enable pin into two independent pins, e.g., normal write and special write. The memory operations can proceed either in page mode or cell-by-cell.

An advantage of the present invention is that a method is provided for protecting memory.

Another advantage of the present invention is that a memory device is provided that can protect its data contents.

The above and still further objects, features, and advantages of the present invention will become apparent upon consideration of the following detailed description of specific embodiments thereof, especially when taken in conjunction with the accompanying drawings.

DETAILED DESCRIPTION OF THE INVENTION

Figure 1:
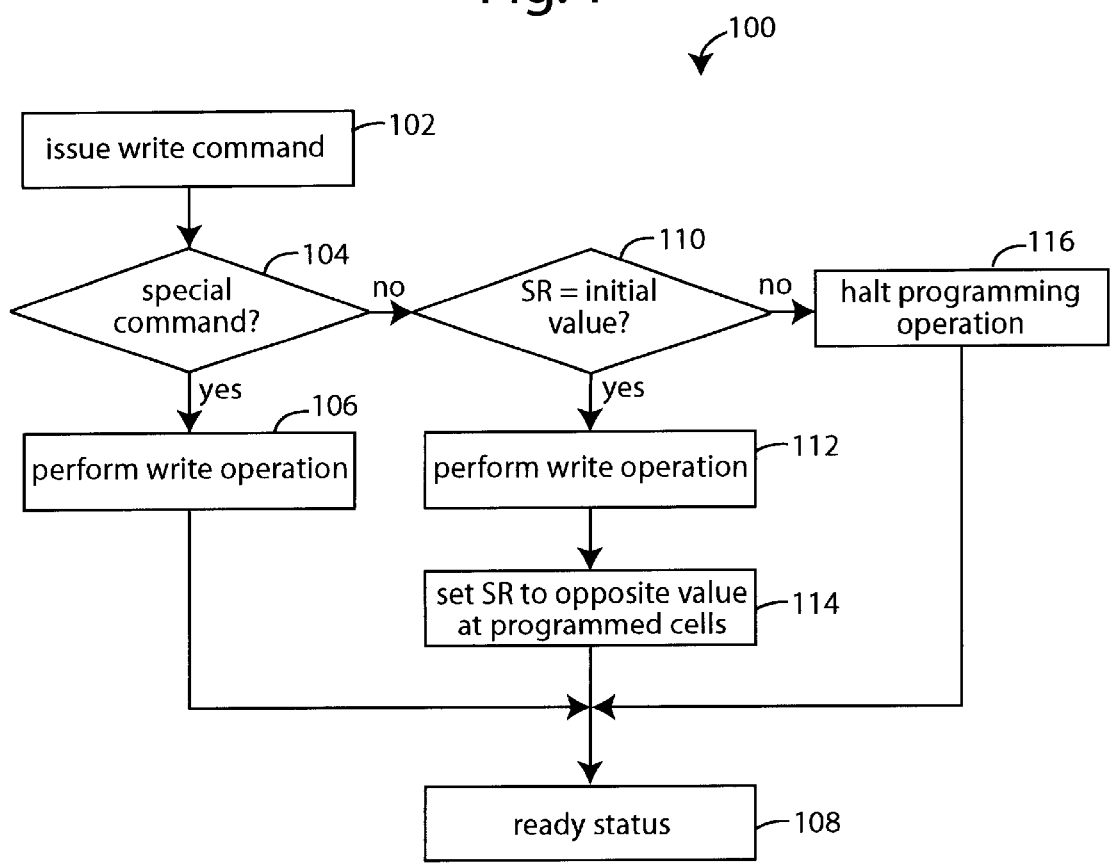
FIG. 1 is a flowchart diagram of a single-address programming embodiment of the present invention.

FIG. 1 represents single-address method embodiment of the present invention for protecting data memory, and is referred to herein by the general reference numeral 100. Method 100 comprises a write step 102 in which data is presented for storage to a device or file. A step 104 looks to see if the write command is special or normal. If special, a step 106 writes the data to the intended destination address. A step 108 returns a ready status. If it is a normal write operation, a step 110 inspects a toggle flag. If the toggle flag is in its pristine state, either one or zero, a write operation is allowed. A step 112 does the writing to the intended location. A step 114 toggles the flag so a subsequent normal write operation will be prevented. A ready status is returned in step 108. If step 110 detected the flag was in its toggled state, a step 116 prevents the write operation. The step 108 returns a ready status without having modified the memory.

Figure 2:
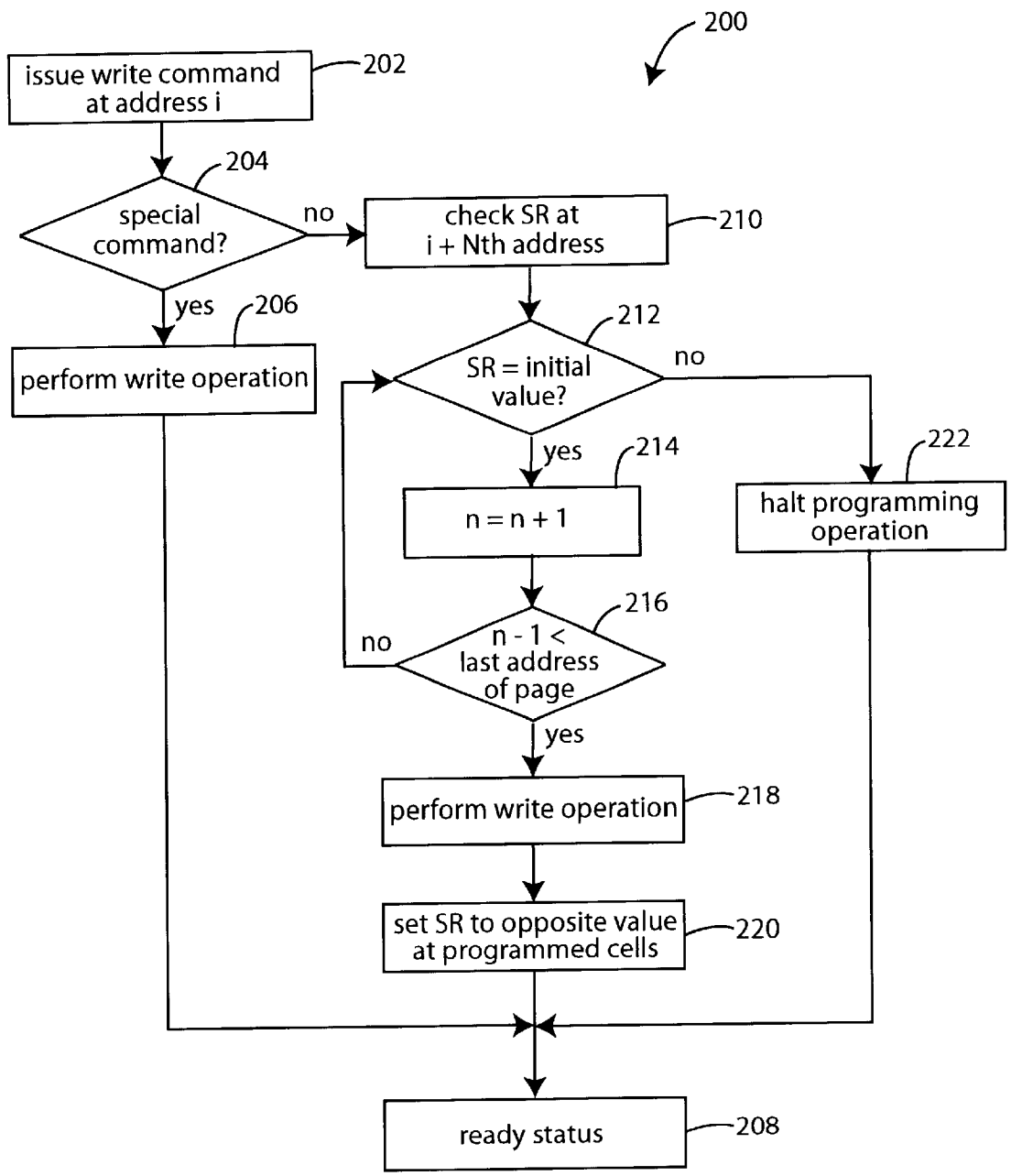
FIG. 2 is a flowchart of a page-address memory programming embodiment of the present invention.

FIG. 2 represents page-address method embodiment of the present invention for protecting data memory, and is referred to herein by the general reference numeral 200. Method 200 comprises a write command step 202 in which a page of data is being presented for storage. A step 204 looks to see if the write command is special or normal. If special, a step 206 writes the page of data to the intended destination addresses. A step 208 returns a ready status. If it is a normal write operation, a step 210 inspects a set of toggle flags that correspond to memory locations within the target page. A step 212 begins a loop to see if all the toggle flags in the whole page are in their pristine state. A step 214 increments the inspection address. A step 216 is the loop test to see if all addresses in the page have been visited. A step 218 writes the page of data to the storage cells in the page. A step 220 sets the toggle flags to prevent future normal write operations. The step 208 returns a ready status. If any of the cell addresses in the page had a toggle flag set, a step 222 halts the page-write operation. The step 208 returns a ready status.

Figure 3:
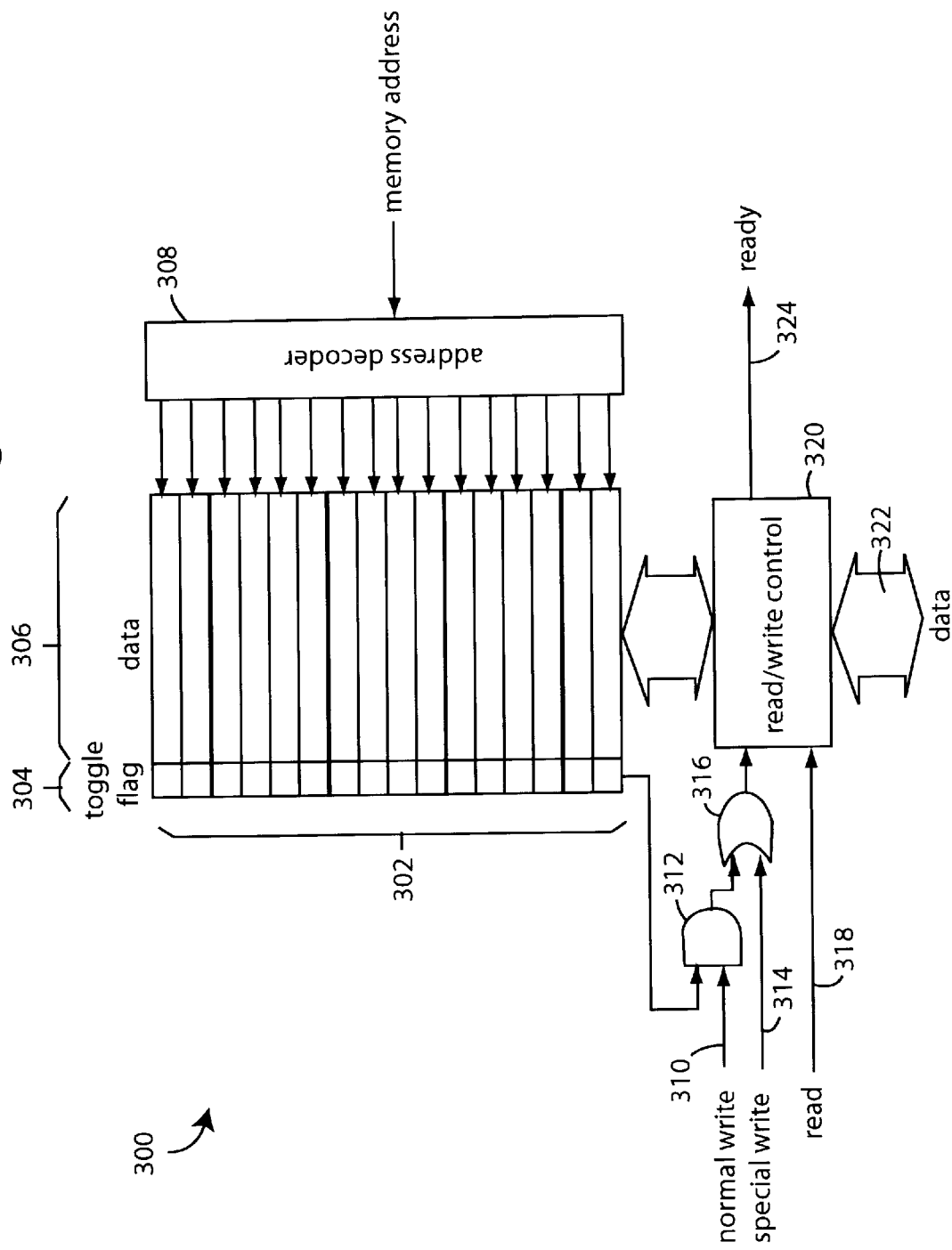
FIG. 3 is a functional block diagram of a memory device embodiment of the present invention as can be implemented with the methods of FIGS. 1 and 2.

FIG. 3 represents a memory device embodiment of the present invention, and is referred to herein by the general reference numeral 300. The memory device 300 can be implemented as a discrete chip or as a core in a larger system-on-a-chip design. The memory device 300 essentially comprises an array 302 including one-bit toggle flags 304 associated with corresponding memory cells 306. These can be further organized into pages of memory and accessed in conventional page mode. An address decoder 308 selects which toggle flag 304 and memory cell 306 to operate on.

Preferred embodiments of the present invention do not use an extra pin for a normal write and a special write operations. Instead, all such control and differentiation is done in embedded firmware or software. FIG. 3 illustrates another embodiment in which two write control pins are used.

A normal write command is received on an input 310 and logically combined in an AND-gate 312 with a bit read line from the selected toggle flag 304. A special-write input 314 is logically combined in an OR-gate 316 which passes either write command through.

The special write input 314 can comprise a discrete device pin that is pulled TRUE, or it can be implemented as a register that must be loaded with a reprogrammable password. Such register could be serially accessed so only one device pin is needed.

A read input 318 is connected to a read/write control logic 320. A data bus 322 is steered into or out of the array 302 according to the type of memory access permitted. If a normal-write operation occurs, the associated toggle flag 304 is toggled by read/write control logic 320 to prevent future normal-write operations. A ready output 324 indicates when read data is valid or the write data can be dropped.

In preferred embodiments of the present invention, the manufacturer of a device will encode a special access codeword or password that will be made known to the customer. The device then can be accessed and a new codeword or password written in so only the customer can thereafter access special write operations.

Although particular embodiments of the present invention have been described and illustrated, such is not intended to limit the invention. Modifications and changes will no doubt become apparent to those skilled in the art, and it is intended that the invention only be limited by the scope of the appended claims.

What is claimed is:

1. A write-protected memory, comprising:
   an addressable memory array including a plurality of memory cells;
   a plurality of toggle flags each associated with each one of said memory cells;
   a special-write input for controlling a direct writing of data to each of said memory cells; and
   a normal-write input for conditionally writing data to each of said memory cells dependent on a pristine state of a corresponding one of the plurality of toggle flags;
   wherein, data is prevented from being written into any of said plurality of memory cells by the normal-write input if said corresponding one of the plurality of toggle flags is not in a pristine state.

2. The memory of claim 1, wherein data is always allowed to written into any of said plurality of memory cells by the special-write input regardless of the state condition of any one of said corresponding plurality of toggle flags.

3. The memory of claim 1, wherein when data is allowed to be written into any of said plurality of memory cells with the normal-write input, the state condition of said corresponding one of said plurality of toggle flags is toggled.

4. The memory of claim 1, wherein when data has been allowed to be written into any of said plurality of memory cells with the normal-write input, the state condition of said corresponding one of said plurality of toggle flags is toggled to prevent future such normal-write operations.

5. The memory of claim 1, wherein data is written in pages into a corresponding page of said plurality of memory cells by the special-write input regardless of the state condition of any one of said corresponding plurality of toggle flags in that page.

6. The memory of claim 1, wherein data is written in pages into a corresponding page of said plurality of memory cells by the normal-write input only when the state condition of all of said corresponding plurality of toggle flags in that page are in their pristine condition.

7. The memory of claim 1, wherein:
   the special-write input is software accessible only, and requires the use of a special access codeword or password for writing said plurality of memory cells if said corresponding one of the plurality of toggle flags is not in said pristine state;
   wherein, said special access codeword or password can be re-written so only a unique user can thereafter access a special write operation.

* * * * *